United States Patent [19]
Wagner et al.

[11] Patent Number: 5,430,595
[45] Date of Patent: Jul. 4, 1995

[54] ELECTROSTATIC DISCHARGE PROTECTION CIRCUIT

[75] Inventors: Glen R. Wagner; Jeffrey Smith, both of Aloha; Jose A. Maiz, Portland; Clair C. Webb, Aloha; William M. Holt, Hillsboro, all of Oreg.

[73] Assignee: Intel Corporation, Santa Clara, Calif.

[21] Appl. No.: 138,472

[22] Filed: Oct. 15, 1993

[51] Int. Cl.$^6$ .................... H02H 9/04; H02H 3/22
[52] U.S. Cl. .................... 361/56; 361/111; 257/355; 327/309
[58] Field of Search .................... 361/18, 56, 58, 91, 361/100, 111, 118, 119, 126, 127; 257/109, 107, 110, 112, 355, 356, 357, 360, 361, 362, 363; 307/100, 130, 540, 542, 549, 551, 557, 559–561, 565, 566; 327/309, 310, 312, 314, 318, 320–322, 325, 326

[56] References Cited

U.S. PATENT DOCUMENTS

| | | | |
|---|---|---|---|
| 4,922,371 | 5/1990 | Gray et al. | 361/91 |
| 5,225,702 | 7/1993 | Chatterjee | 257/360 |
| 5,274,262 | 12/1993 | Avery | 257/362 |
| 5,287,241 | 2/1994 | Poar | 361/56 |

*Primary Examiner*—A. D. Pellinen
*Assistant Examiner*—Ronald W. Leja
*Attorney, Agent, or Firm*—Blakely, Sokoloff, Taylor & Zafman

[57] ABSTRACT

A device for protecting an integrated circuit (IC) against electrostatic discharge (ESD) includes a self-triggered silicon controlled rectifier (STSCR) coupled across the internal supply potentials of the integrated circuit. The STSCR exhibits a snap-back in its current versus voltage characteristic which is triggered at a predetermined voltage during an ESD event. As large voltages build up across the chip capacitance, the predetermined voltage of the SCR is triggered at a potential which is sufficiently low to protect the internal junctions of the IC from destructive reverse breakdown. The STSCR comprises a pnpn semiconductor structure which includes a n-well disposed in a p-substrate. A first n+ region and a p-type region are both disposed in the n-well. The n+ and p-type regions are spaced apart and electrically connected to form the anode of the SCR. The ESD protection device also includes diode clamps between the periphery and internal power supply lines, and a novel well resistor which provides a distributed resistance further protecting sensitive output buffer circuitry.

14 Claims, 5 Drawing Sheets

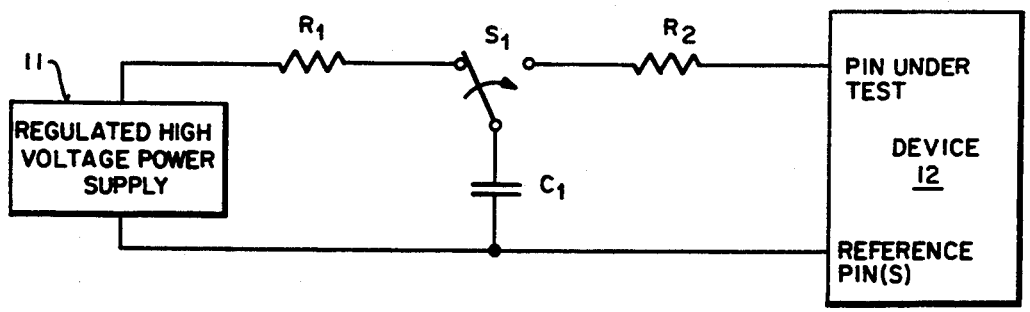
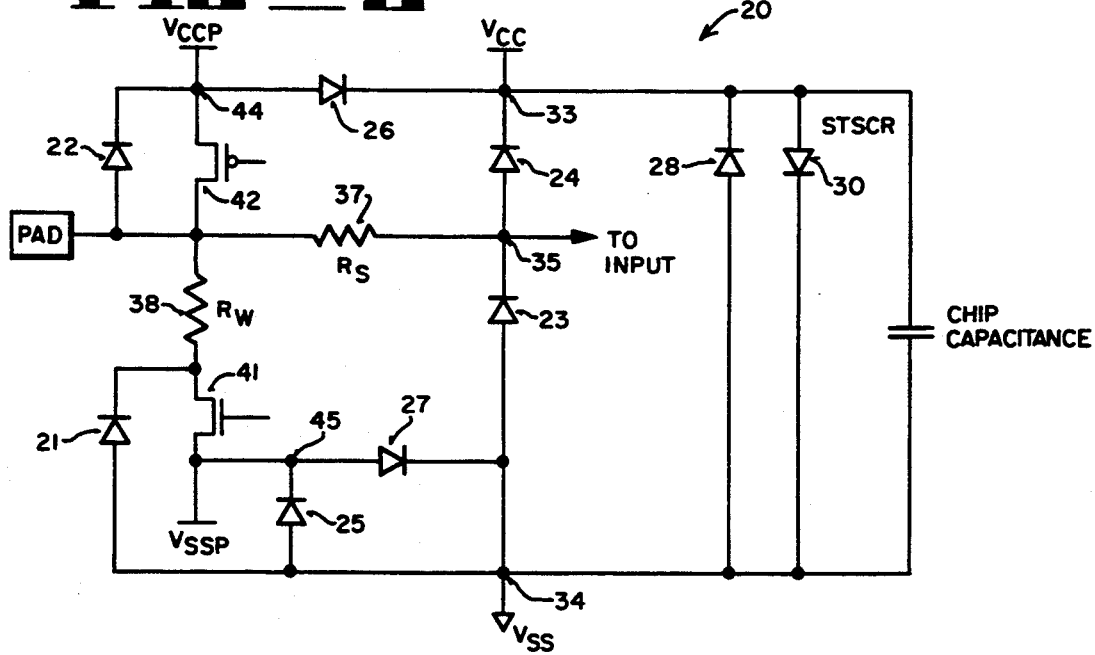
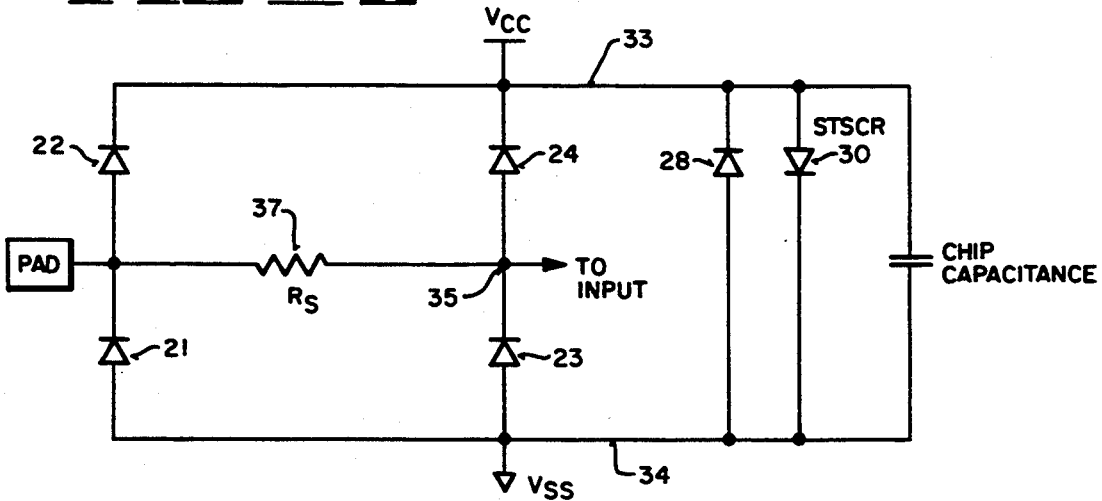

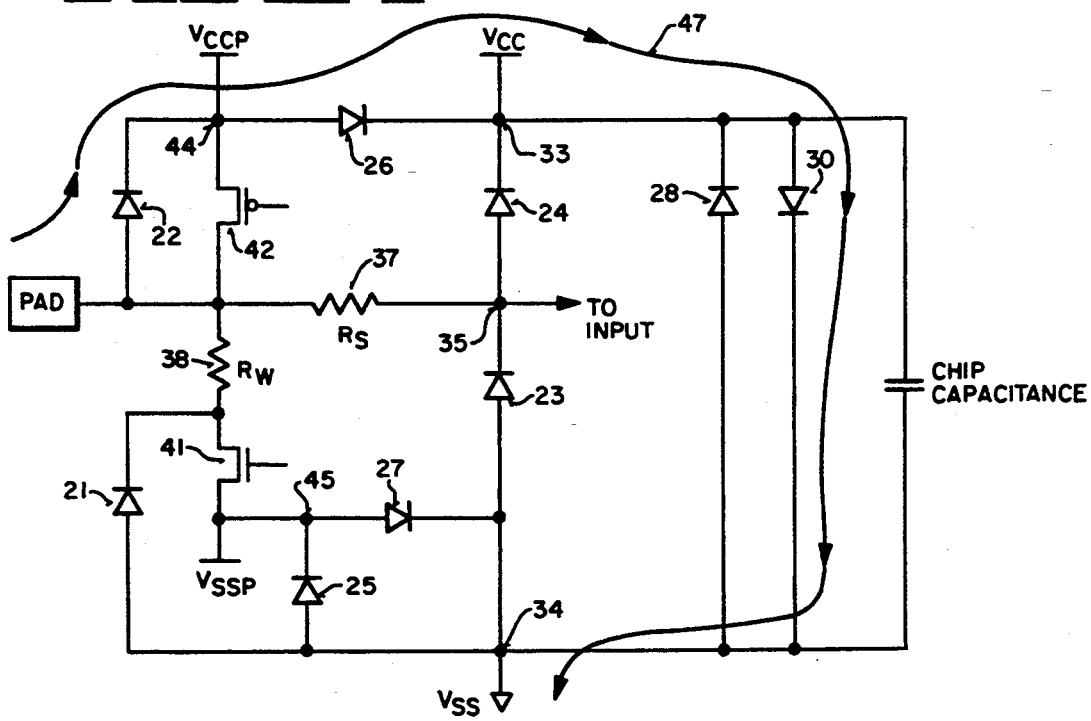
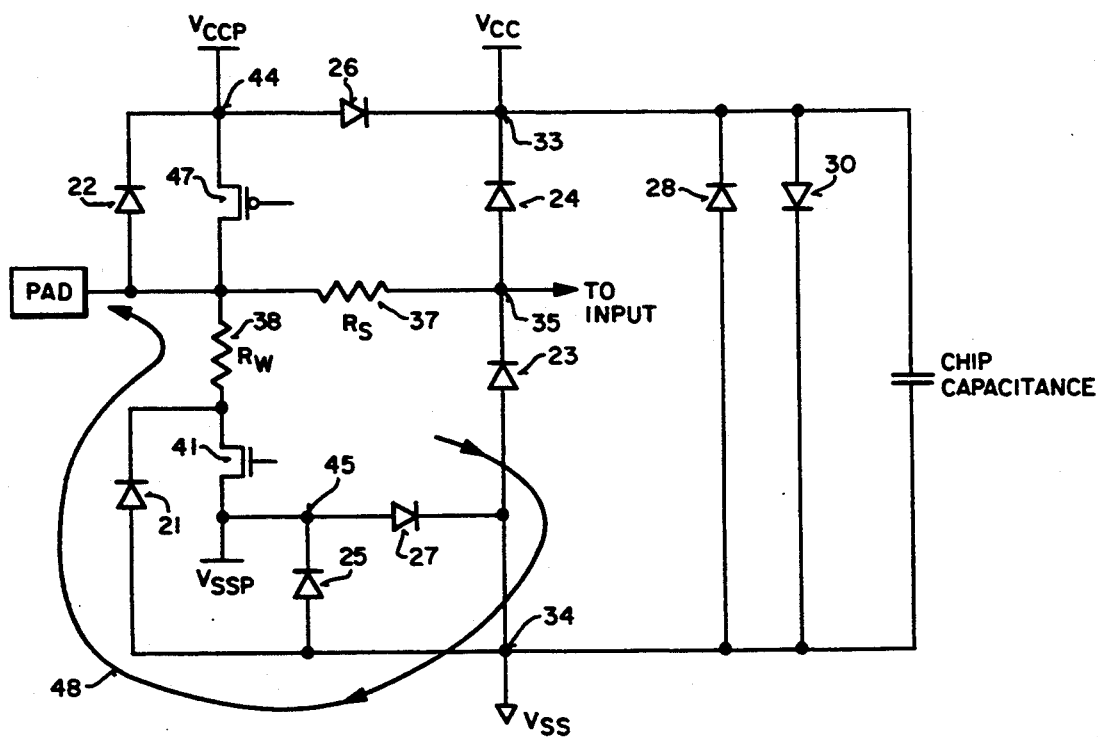

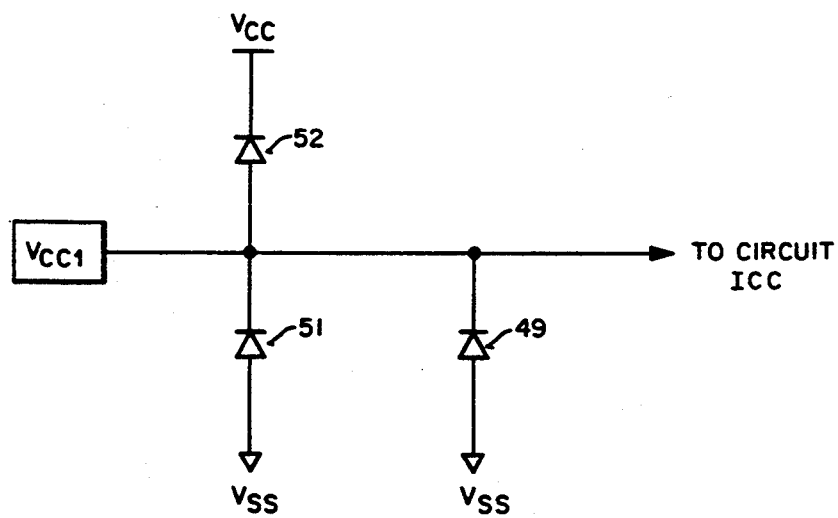
FIG_6
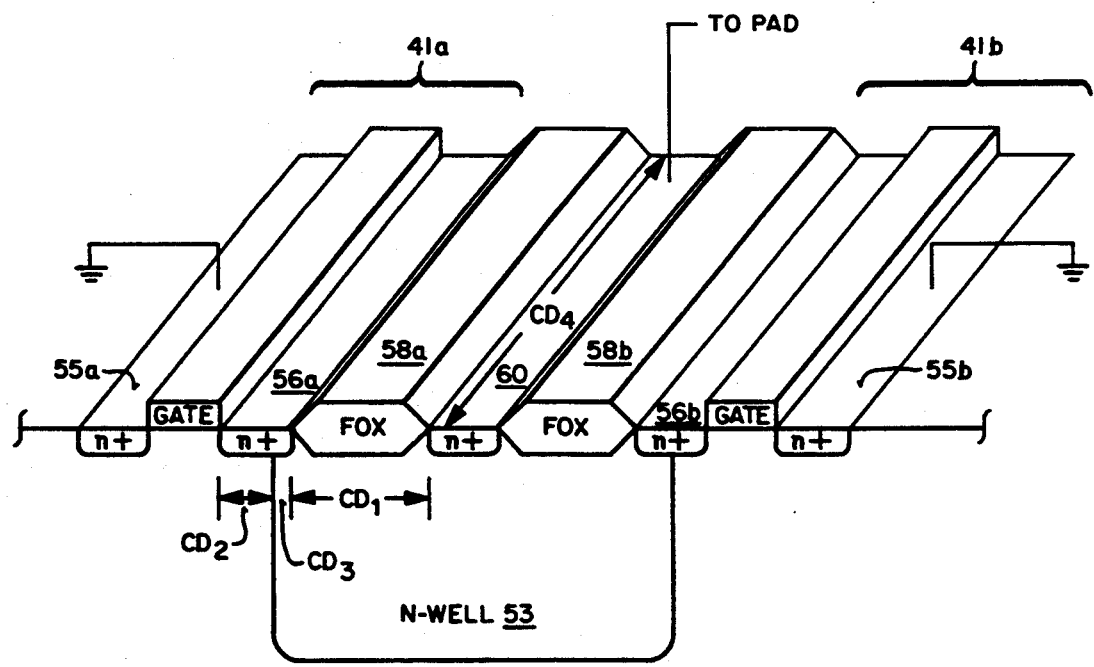
FIG_7

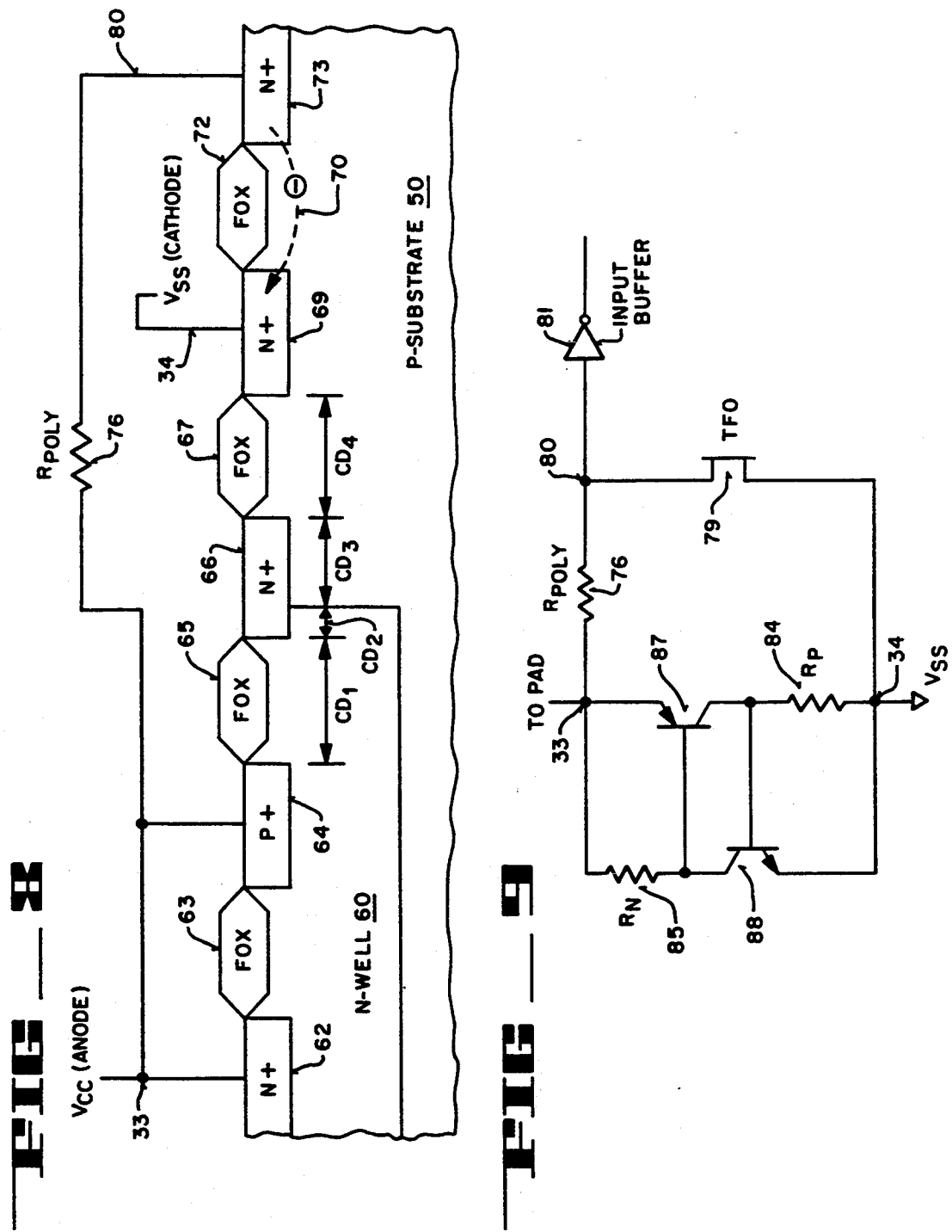

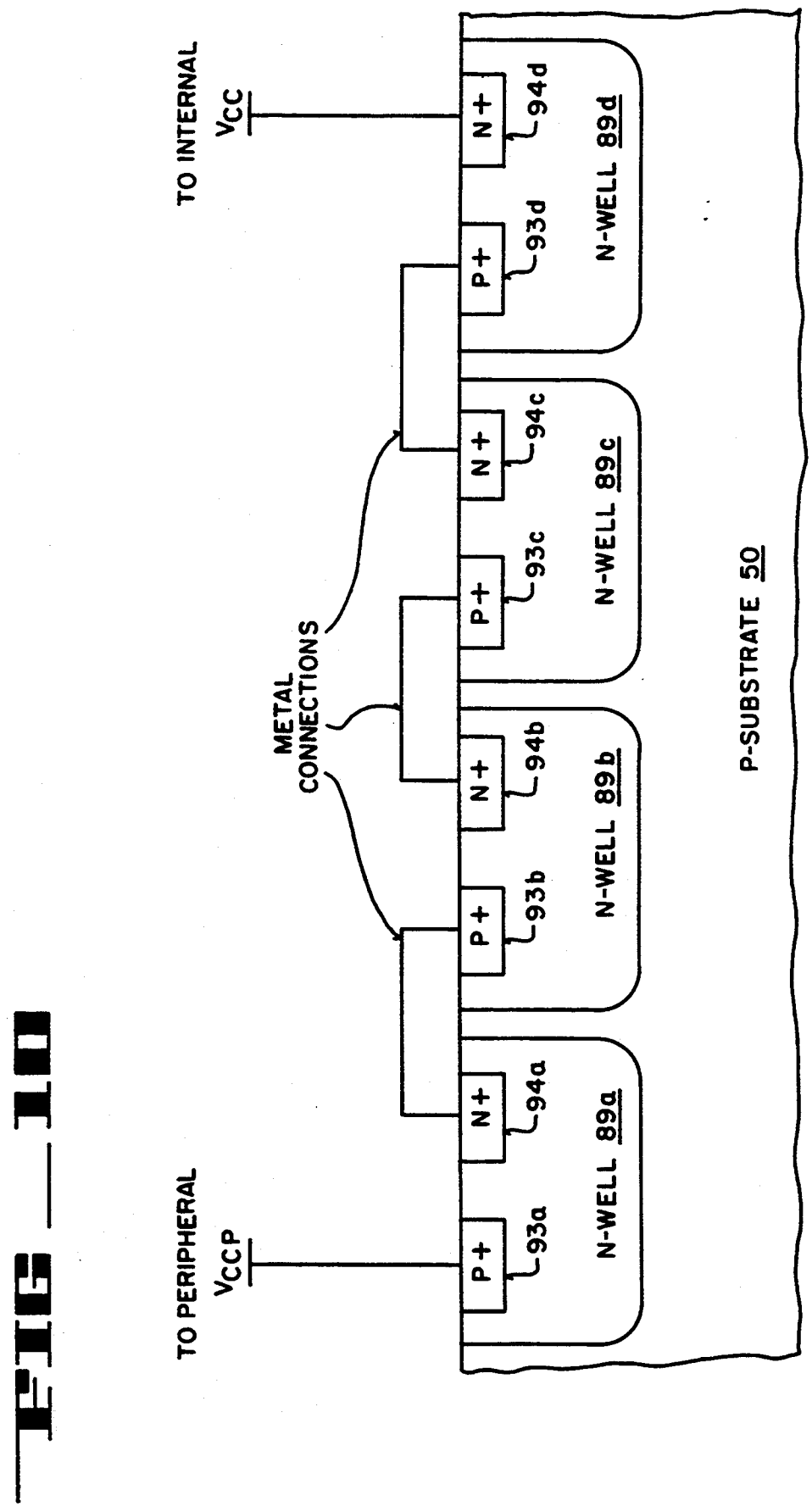
FIG_10

ELECTROSTATIC DISCHARGE PROTECTION CIRCUIT

FIELD OF THE INVENTION

The present invention relates to the field of electrostatic discharge protection circuits. More particularly, the present invention relates to electrostatic discharge devices for protecting input and output devices in an integrated circuit.

BACKGROUND OF THE INVENTION

It has been known for many years that extremely high voltages (e.g. 10,000 volts or greater) can develop in an integrated circuit (IC) due to the build-up of static charge. Electrostatic discharge (ESD) refers to the phenomena whereby a high energy electrical discharge of current is produced at the input and/or output nodes of an integrated circuit as a consequence of static charge build-up. Electrostatic discharge is a serious problem for semiconductor devices since it has the potential to disable or destroy the entire integrated circuit. Because ESD events occur most often across the junction of an input or output transistor, circuit designers have concentrated their efforts on developing adequate protection mechanisms for these sensitive circuit elements. Ideally, an ESD protection device should be able to discharge an extremely large potential across any two pins of an IC in a nondestructive manner.

Previous technologies relied extensively upon a phenomena commonly known as "snap-back" for providing ESD protection. The difficulty with this approach is that the junction breakdown and bipolar snap-back phenomena are highly nonuniform, and also have a positive temperature coefficient for conduction. This results in a highly localized current conduction that makes these devices inherently weak and susceptible to localized junction damage. Device scaleability is also a problem because of the localized current conduction. Moreover, increasing the device size in these technologies does not necessarily improve the ESD performance.

Actually, the snap-back phenomena is a potentially valuable tool for ESD protection if the device experiencing snap-back can withstand the high energy levels without irreversible damage. The snap-back phenomena refers to the use of a junction breakdown to control current and voltage behavior in the manner of a voltage clamp. A snap-back device is designed to keep the voltage low enough to protect sensitive gate dielectrics. By way of example, n-channel devices were protected from irreversible damage in earlier technologies by distributing resistance within a diffusion layer. In other words, by spacing the metal-to-drain diffusion contact several microns away from the gate edge the drain diffusion introduced a significant resistance into the snap-back circuit. This distributed diffusion resistance provided a negative feedback to current crowding, thus increasing current conduction uniformity and raising ESD performance to more acceptable levels.

The problem with this approach is that many advanced semiconductor processes now utilize diffusions clad with titanium or a titanium alloy (e.g., titanium salicide). Alloying a metal such as titanium onto the diffusion regions has the effect of reducing the distributed resistance by at least an order of magnitude. The end result is that the snap-back behavior is no longer effective for ESD protection.

Another difficulty in designing ESD circuits is the demanding performance requirements which must be met. For example, one of the primary industry standards for measuring ESD robustness—MIL-STD-883C method 3015.7 Notice 8—requires ESD "zapping" for all possible pin and power supply combinations. In the past, ESD protection circuits have had difficulty in meeting these stringent military standard performance requirements while maintaining adequate noise immunity.

Therefore, what is needed is a robust electrostatic protection circuit which is capable of meeting the increased demands on product design performance. As will be seen, the present invention provides a ESD protection circuit which exceeds industry performance goals while maintaining noise immunity margins. In addition, the present invention provides for an inherently uniform current conduction process which may be utilized in a great variety of semiconductor processes—including those which utilize diffusions clad with titanium or a titanium alloy.

SUMMARY OF THE INVENTION

The present invention relates to a device for protecting an integrated circuit (IC) against electrostatic discharge (ESD). The basic design of the present invention is capable of being implemented for a variety of different circuit protection requirements. For instance, in one embodiment the invention can be used for protecting an input buffer only against an ESD event. In another embodiment, an output buffer of an integrated circuit can be protected and still in yet another embodiment, the ESD protection circuit of the present invention can be utilized to protect a terminal of an integrated circuit which is capable of both receiving inputs and providing outputs as an external signal.

In each instance, the present invention includes as a key feature, a self-triggered silicon controlled rectifier which is preferably coupled across the internal supply potentials of the integrated circuit. For example, the invented SCR has its anode coupled to a first supply potential and its cathode coupled to a second internal supply potential. The SCR exhibits a snap-back in its current versus voltage characteristic which is triggered at a predetermined voltage during an ESD event. As large voltages build up across the chip capacitance, the predetermined voltage of the SCR is triggered at a potential which is sufficiently low to protect the internal junctions of the IC from destructive reverse breakdown. At the point it triggers, the SCR provides a low resistance path between the first and second supply potentials.

In one embodiment, the SCR comprises a pnpn semiconductor structure which includes a n-well disposed in a p-substrate. A first n+ region and a p-type region are both disposed in the n-well. The n+ and p-type regions are spaced apart and electrically connected to form the anode of the SCR. Also included is a second n+ region.

BRIEF DESCRIPTION OF THE DRAWINGS

The present invention will be understood more fully from the detailed description that follows and from the accompanying drawings. The drawings, however, should not be taken to limit the invention to the specific embodiments shown, but are for explanation and understanding only. For example, the relative layer thicknesses shown in the drawings should not be construed as representing actual thicknesses.

FIG. 1 illustrates a MIL-STD 883C, Method 3015.7, Notice 8 electrostatic discharge testing circuit.

FIG. 2 is a circuit schematic diagram of the electrostatic discharge protection circuit of the present invention.

FIG. 3 is a circuit schematic diagram of another embodiment of the invention which provides ESD protection for a typical input-only pin.

FIG. 4 illustrates the current path through the circuit of the present invention during a positive electrostatic discharge event with respect to $V_{ss}$.

FIG. 5 illustrates the current path through the circuit of the present invention during a negative electrostatic discharge event with respect to peripheral $V_{ss}$.

FIG. 6 illustrates a special ESD protection circuit for separated internal power supplies.

FIG. 7 is a cross-sectional view of the N-well resistor that is incorporated in one embodiment of the present invention.

FIG. 8 is a cross-sectional view of the self-triggered silicon-controlled rectifier utilized in the invented ESD protection circuit.

FIG. 9 is a circuit schematic diagram of the self-triggered silicon-controlled rectifier shown in FIG. 8.

FIG. 10 is a conceptual illustration showing a cross-sectional view of the diode power supply clamp utilized in one embodiment of the present invention.

DETAILED DESCRIPTION

A robust electrostatic discharge (ESD) protection circuit for use in MOS, CMOS, bipolar and BiCMOS integrated circuits is described. In the following description, numerous specific details am set forth such as circuit configurations, conductivity types, currents, voltages, etc., in order to provide a thorough understanding of the present invention. It will be obvious, however, to one skilled in the art that these specific details may not be needed to practice the present invention. In other instances, well-known circuit elements and structures have not been described in particular detail in order to avoid unnecessarily obscuring the present invention.

FIG. 1 illustrates the Human Body Model (HBM) pulse test used to satisfy MIL-STD-883C Method 3015.7, Notice 8. According to this test, a device 12 is coupled to a regulated high voltage power supply 11 through a network comprising resistors $R_1$, $R_2$, switch $S_1$, and capacitor $C_1$. The discharge pulse or "zap" is generated by capacitor $C_1$, which has a capacitance of 100 picofarads; charged to several thousand volts through resistor $R_1$. Resistor $R_1$ has a value of between 1 and 10 Mohms.

In performing the test, capacitor $C_1$ is first adequately charged through $R_1$; then relay $S_1$ is switched so that capacitor $C_1$ is coupled to device 12 through resistor $R_2$. The potential on capacitor $C_1$ is then discharged through resistor $R_2$ (1.5 Kohm) to the pin being tested. The MIL-STD requires that the zap be delivered three times positively and three times negatively for all possible discharge combinations. These combinations are as follows:

1. All signal pins with respect to each separate power supply grounded.
2. All supply pins with respect to each other, each with separate power supply grounded.
3. All signal pins with respect to all other signal pins grounded.

With reference now to FIG. 2, there is shown a circuit schematic diagram of the ESD protection circuit of the present invention. In the most general case, the circuit of FIG. 2 is utilized to provide ESD protection at an input/output (I/O) buffer, and utilizes separated $V_{cc}$ and $V_{ss}$ power supplies. The separated power supplies are represented as $V_{ccp}$ and $V_{ssp}$—denoting power supplies for the periphery, as opposed to the internal circuitry. It should be understood that the circuit of FIG. 2 is advantageously formed in the same silicon substrate which forms the integrated circuit to be protected. Thus, the invented ESD protection circuit is easily fabricated as part of a normal integrated circuit manufacturing process.

The key circuit elements used in protecting a typical I/O pin will now be described in further detail. These circuit elements comprise a combination of discrete devices and parasitic structures.

One of the first things to note about the ESD protection circuit of FIG. 2 is that it employs separated power supplies. For example, the peripheral power supplies $V_{ccp}$ and $V_{ssp}$ are coupled to nodes 44 and 45, respectively, whereas the internal power supplies $V_{cc}$ and $V_{ss}$ are coupled to respective nodes 33 and 34. Each of the peripheral power supplies is coupled to its corresponding internal power supply through a diode clamp. By way of example, diode 26 connects node 44 to node 33, whereas diode 27 connects node 45 to node 34. Note that the buffer circuitry which ordinarily forms part of the output circuitry of the IC is shown in FIG. 2 by the combination of PMOS transistor 42 and NMOS transistor 41. Transistors 41 and 42 are coupled in series between nodes 45 and 44.

Practitioners in the art will appreciate that a central feature of the present invention is the fact that the input/output buffer circuitry is coupled to the peripheral power supplies. This means that any noise generated by the I/O devices is effectively isolated from the internal supply lines of the IC. Diode clamps 26 and 27 maintain a separation between the noisy peripheral supply lines and the internal power supplies. The diode clamping mechanism also provides the lowest possible impedance path between the chip's peripheral and core power supplies. Diodes 26 and 27 may comprise one or more diodes in series, depending upon the level of noise isolation which is desired between the two supplies. As an example, if it is desired to provide at least 2.0 volts of noise isolation between $V_{ccp}$ and $V_{cc}$, then diode 26 should comprise at least four diodes coupled in series.

FIG. 10 is a cross-sectional view of an exemplary diode clamp structure, which is made up of four diodes coupled in series. The diode is shown consisting of a set of separate structures disposed in substrate 50. Each structure includes both p+ and n+ diffusions (93 and 94, respectively) disposed in a floating n-well 89. Each of the four separate n-well regions 89a–89d are formed in p-type substrate 50. By way of example, the first diode in the series comprises diffusion regions 93a and 94a, with p+ diffusion region 93a being coupled to the peripheral power supply $V_{ccp}$.

The series connection of separate diodes which comprise the diode clamp may be coupled together using any available metal layer. The metal connections are always from the n+ region of the previous diode stage to the p+ region of the next stage; that is, n+ region 94A is coupled to p+ region 93B, n+ region 94B is coupled to p+ region 93C, and so on. At the cathode terminal of the diode clamp, n+ region 94D is coupled to the internal power supply $V_{cc}$. Note that the power supply diode clamp 27 can be implemented using the same floating n-well concept shown in FIG. 10. For diode 27, however, the p+ side is connected to the peripheral $V_{ssp}$ supply and the n+ side of the diode is connected to internal $V_{ss}$. Note that diodes 26 and 27 are designed to provide a current path during an electrostatic discharge event.

One of the key elements in the ESD protection circuit of FIG. 2 is the self-triggered silicon controlled rectifier (STSCR) 30. A silicon-controlled rectifier (SCR) is a pnpn semiconductor device which exhibits a snap-back in its current versus voltage characteristic. STSCR 30 is designed to trigger at approximately 12–13 volts under an ESD zap condition. For purposes of analysis, STSCR 30 can be treated as an open circuit during an ESD event, until approximately 12 to 13 volts. At that point, STSCR 30 acts as a low resistance short between $V_{cc}$ and $V_{ss}$. It is important to recognize that the 12–13 volt level is low enough to adequately protect internal junctions from destructive reverse breakdown.

It is also worth noting that STSCR 30 is coupled across nodes 33 and 34; that is, STSCR 30 is connected across the internal chip capacitance which includes both the diffusion capacitance and the package capacitance. A typical chip capacitance for an integrated circuit is on the order of 10,000 picofarads. Such a large capacitance has the potential to dissipate most of the energy from the ESD zap event should it be in the discharge path. When the STSCR triggers, however, it functions to shunt any destructive current away from the internal chip capacitance, thereby protecting the core of the IC. It should also be understood that order to function properly STSCR 30 must not latch-up during normal circuit operations. This means that STSCR 30 must only be activated during a true ESD event. Proper spacing and control of certain critical device dimensions ensures that STSCR 30 is not triggered during normal circuit operations.

Diode 28 associated with STSCR 30 and is shown being coupled between node 33 and 34. In implementing the protection circuit of FIG. 2, diode 28 is formed by the pn junction between the p-substrate and the n-well tap associated with the STSCR structure. Hence, diode 28 is connected between internal $V_{cc}$ and $V_{ss}$. This aspect of the present invention will become more apparent when the cross-sectional structure of STSCR 30 is discussed in more detail below.

With continuing reference to FIG. 2, the connection between the pad and the input gate is made via the local input gate clamp network comprising resistors $R_s$ (labeled as resistor 37) and diodes 23 and 24. A typical value for resistor 37 is on the order of 100 ohms. In most cases, diodes D3 and D4 are optimally located adjacent to the input gate circuitry to maintain a low voltage near the gate. The local input gate clamp acts as a voltage dropping network, clamping the gate voltage of the input side of the I/O buffer to an acceptable level. By way of example, this level may represent the gate dielectric breakdown voltage of an input buffer. In one embodiment, resistor 37 comprises an ordinary polysilicon resistor. Further note that diodes 23 and 24 are usually small in size (e.g., 30 microns wide) and are constructed similar to diodes 26 and 27.

As discussed earlier, one of the problems with prior art designs which include salicided diffusions is the problem of damage to the transistor devices associated with the I/O buffer. Because salicidation essentially removes the normal resistance associated with the drain diffusion, current spreading is no longer present in these technologies and damage can occur at both the source and drain regions. For this reason, the present invention includes a specialized n-well resistor 38 (labeled $R_w$ in FIG. 2). Resistor $R_w$ provides current spreading into the drain of the n-channel output transistor 41 and comprises a distributed n-well resistor structure. This makes device 41 much stronger and therefore able to handle higher current densities.

FIG. 7 is a cross-sectional view of n-well resistor 38 as implemented in the currently preferred embodiment. Note that the n-well resistor is fully integrated into the drain of device 41. In FIG. 7, device 41 is shown split into separate MOS structures 41a and 41b. MOS transistor 41A comprises n+ regions 55a and 56a. The gate of transistor 41a is electrically coupled to the gate of transistor 41b, which also includes n+ regions 56b and 55b. The pad connection for this structure is comprises n+ region 60 disposed within n-well 53. Note that n+ region 60 is separated from MOS transistors 41a and 41b by field oxide regions 58a and 58b, respectively.

In the structure of FIG. 7, the n+ drain diffusions 56a and 56b extend across the boundary of n-well 53, creating a low-resistance salicide connection from the well to the drain. The n+ diffusion region 60 is located a predetermined distance away from these drain diffusions and provides the n-well tap to the bond pad. Current flows laterally from n+ tap 60, through the resistive n-well region 53, and then to the drain diffusion regions 56a and 56b. Note that in this configuration the doping level of n-well 53 determines the value of resistor Rw, which in a current embodiment is approximately 100 ohms.

There are several dimensions which are critical to the proper performance of n-well resistor 38. The first critical dimension, $CD_1$, represents the spacing in the floating n-well 53 between the well edge of n+ drain diffusion 56 and the edge of n+ well tab 60. Dimension $CD_1$ determines the effective resistance of the n-well resistor and ultimately the overall ESD performance of n-channel device 41.

The second critical dimension, $CD_2$, represents the spacing from the gate edge to the n-well boundary. Adequate spacing of dimension $CD_2$ is important to keep the n-well from reaching the gate edge during processing.

The third critical dimension, $CD_3$, represents the extent of the n+ drain diffusion overlap beyond the n-well boundary. This dimension is important to maintain continuity between the n-well and drain regions of the transistor.

The final critical dimension, $CD_4$, defines the width of the resistive segment (i.e., $R_w$) of output transistor 41. Obviously, as the width of the resistor structure increases, the effective resistance $R_w$ decreases—even if $CD_1$ remains constant.

Increasing the dimension of $CD_4$ beyond a certain point reduces ESD performance significantly. It is believed that increasing the width of the n-well resistor compromises the benefit of uniform current spreading. During conduction of very large currents (as those experienced during an ESD event), uniform heating and resistance cannot be maintained for very large segment widths. This is particularly true during a snap-back event, where most of the current and heat is initially focused at a single point along the gate edge.

With reference again to FIG. 2, the remaining circuit elements not yet discussed include diodes 21, 22 and 25. Diode 22 is coupled between the pad and node 44 and operates to shunt current to power supply $V_{ccp}$ when the pad or pin is zapped positively. Diode 22 is preferably located adjacent to transistor 42 in order to minimize the resistance between the anode of diode 22 and the drain of transistor 42. Similarly, diode 21 is shown coupled between the drain of transistor 41 and node 34. Diode 21 is inherent in the layout of the output buffer and guards against an ESD event whenever the pad is zapped negatively with respect to $V_{ss}$. Diode 25 is also inherent in the layout of the output buffer and is connected between $V_{ss}$ and $V_{ssp}$. Both of diodes 21 and 25 comprise large, vertical diodes formed between the n-channel drain/source transistor regions and the p-substrate.

FIG. 3 illustrates an alternative embodiment of the ESD protection circuit of the present invention for a typical input-only pin. Without the presence of output transistors 41 and 42, the circuit of FIG. 3 is simplified considerably. Note that the same basic structure of FIG. 2 is preserved in the embodiment of FIG. 3, except that transistors 41, 42 and associated resistor 38 and diode 25, are not included. Also, since the circuit of FIG. 3 is designed to handle input-only signals, there is no need for separate power supplies and clamping diodes 26 and 27. (Input pins are usually tied to the internal power supplies making the special ESD power supply diode clamps unnecessary.) In all other respects, the circuit of FIG. 3 is the same as that described above for FIG. 2. Practitioners in the art will appreciate that removal of the MOS output drivers eliminates the fragile thin gates and thus decreases the cell capacitance.

FIGS. 4 and 5 are presented as examples to further explain how the present invention functions during an ESD event. FIG. 4 illustrates the current path through the circuit of FIG. 2 during a positive ESD zap with respect to $V_{ss}$. FIG. 5, on the other hand, illustrates the current path during a negative ESD zap with respect to peripheral $V_{ssp}$. Before considering each of these examples, it is helpful to one's understanding to analogize an ESD event to a water dam. In this simple analogy, the water in a reservoir represents the static charge accumulated on the IC; the reservoir capacity represents the structure capacitance, and the stream side of the dam represents ground. The dam, itself, represents the protection structure integrated into the I/O buffer.

Obviously, water will force its way across the dam in one way or another when the reservoir becomes full. When the reservoir reaches its capacity, either water will flow over the top of the dam, or the dam will burst at its most vulnerable or weakest spot. Previous approaches to ESD protection focused on the points of weakness—identifying myriad ways to strengthen these points. The result was a set of very complicated, ad hoc ESD circuits that failed in various ways in different applications. The contrary approach of the present invention, however, is to deliberately construct a robust "floodgate" to predictably shunt charge to ground. This approach keeps design variations to a minimum and produces a consistent protection circuit that provides a predictable discharge path for the current.

Applying this theory to the I/O ESD protection circuit of FIG. 2, one can easily identify where the current flows during an ESD event. For example, in FIG. 4, arrow 47 highlights the current path taken during an ESD event when the pin is zapped positively with respect to $V_{ss}$. In this case, diodes 22 and 26 are turned on, shunting the current to the core and charging the chip capacitor to $V_{ss}$. This large capacitor (around 10,000 picofarads for a microprocessor) dissipates most of the ESD energy when charging. As the ESD zap voltage increases the resulting potential across the chip capacitance eventually reaches 12–13 volts. At this point, STSCR 30 is triggered to provide a low impedance path to $V_{ss}$.

FIG. 5 highlights the opposite case where the I/O pin is zapped negatively with respect to the peripheral supply voltage $V_{ssp}$. Here, current flows from peripheral $V_{ssp}$, through the diode clamp 27 to $V_{ss}$. Then, the discharge current path continues through the n-channel drain diode 21, and finally out to the pin through diode 21 and resistor 38.

When implementing ESD protection, it should be understood that connectivity plays an important role in the success of the circuit. In the case of the ESD protection circuit of FIG. 2, the power supply clamping diodes 26 and 27, and STSCR 30 may be located far from the actual I/O buffer they are designed to protect. The circuit current path impedances, however, should be kept to a minimum so that other parasitic paths do not become the preferred discharge pass. On the other hand, diodes 23 and 24 are preferably located as close to the input device node 35 as possible in order to minimize voltage drops.

Furthermore, because instantaneous ESD zap currents can easily exceed several amperes and last for several nanoseconds, metal width becomes an important concern. For example, metal extending from the bond pad to the I/O cell at node 35 (called the "leadway metal") can fuse during an ESD event if the metal width is not wide enough. For this reason, the leadway metal should have a width which is sufficient to adequately handle a large discharge event.

Practitioners in the art also recognize that special ESD protection requirements are often necessary for internal power supplies that support a small amount of internal logic, yet do not support any I/O or output buffers. This kind of configuration is commonly used for analog or internal clock supplies. In these situations, each separate internal power supply must be protected as if it were an input. A circuit which provides protection in these special situations in illustrated in FIG. 6.

FIG. 6 shows an internal power supply $V_{cc1}$ coupled to $V_{cc}$ through diode 52 and to $V_{ss}$ through diode 51. Diodes 51 and 52 are made up of 1, 2, 3, or 4 diodes coupled in series. Parasitic diode 49 is coupled between $V_{cc1}$ and $V_{ss}$. This diode highlights one of the primary reasons for this special protection scheme. Diode 49 is preferably formed from the n-well tap for the internal logic to the substrate. When the power supply pin is zapped negatively with respect to $V_{ss}$, diode 49's forward biasing will conduct all of the ESD current. Typically, power supply bussing in this kind of circuit block includes many sections of relatively narrow, non-uniform width metal lines that can be easily fused open during an ESD event. For this reason, diode 52 provides a parallel current path with a very robust metal design to withstand ESD currents. Thus, the protection circuit of FIG. 6 effectively shunts current away from the sensitive metal bussing of the internal logic.

With reference now to FIG. 8, there is shown a cross-sectional view of the basic self-triggered SCR structure employed in the protection circuit of FIG. 2. This structure provides an extremely robust protection mechanism and allows for straightforward integration into any CMOS, bipolar or BiCMOS process. Additionally, the fact that the triggering of the STSCR is controlled by the junction breakdown voltage makes it easy to implement and effective in scaled integrated circuit technologies.

The structure of STSCR 30 includes an n+ region 62 and p+ region 64 disposed in an n-well 60. Both regions 62 and 64 are coupled together to node 33, which forms the anode of the device. As shown in FIG. 2, the anode of STSCR 30 is coupled to Vcc. Regions 62 and 64 are separated by a thick field oxide region 63. It should also be noted that diode 28 (again referring to FIG. 2) is formed by the junction between n-well 60 and p-substrate 50. Thus, diode 28 is inherent in the design of the STSCR shown in FIG. 8.

Continuing with the description of the basic structure, p+ region 64 is separated by n+ region 66 by field oxide 65. The n+ diffusion 66 overlaps the edge of n-well 60 to control the triggering voltage. Additionally, n+ region 66 is separated from n+ region 69 by field oxide region 67. In turn, n+ diffusion region 69 is coupled to node 34, which forms the cathode of STSCR 30. Note that there are several critical dimensions associated with the widths of the various regions 65–67. These will be discussed in more detail later.

The remainder of the basic STSCR structure includes a thick-field oxide device adjacent to the cathode of the SCR. This thick-field oxide device comprising n+ region 69, n+ region 73 and field oxide region 72. Note that n+ region 73 is coupled via line 80 to a resistor 76. Resistor 76 is coupled between node 33 and diffusion region 73. This Resistor 76 preferably comprises an ordinary polysilicon resistor and functions to protect the thick-field oxide device from high currents or voltages. The thick-field oxide device aids in the triggering of the SCR device by providing additional electrons in the form of a leakage current. This leakage current is shown in FIG. 8 by dashed line 70.

The thick field oxide device in the STSCR structure serves two primary purposes. The breakdown of the internal n+p junction lets carriers leak to the substrate in a way that encourages forward biasing of the pn+ cathode junction, thus enabling the self-triggering feature. Additionally, the thick-field oxide device acts as a voltage divider (poly resistor 76 to n+p junction) to clamp the voltage of the transistor gates tied to it should there be a short or voltage spike at the SCR. When the invented SCR is subjected to reversed polarity pulsing, it provides a well-strapped, large-area diode that is extremely robust under forward bias.

The operation of the STSCR shown in FIG. 8 is based on the formation of a pnpn structure, with the central n+ diffusion 66 overlapping n-well 60 to control the triggering voltage. The SCR robustness under an ESD event arises from the inherent uniformity in current conduction which allows dissipating large energy pulses without self-destructing. Once triggered, the SCR clamps the voltage between its terminals to approximately 3–5 volts, thereby preventing damage to the internal circuitry of the integrated circuit.

As mentioned above, the relatively low triggering voltage required to activate the protection scheme before harmful voltages can develop is achieved by overlapping the n+ diffusion region 66 with the boundary of the n-well region 60. Recognize that in normal CMOS and BiCMOS processes, n-well breakdown voltages are approximately 40 volts. In contrast, the n+ diffusion breakdown voltage in the invented structure is on the order of 12 to 13 volts. It is this latter breakdown voltage which triggers the bipolar action of the PNP and NPN transistor to provide a controlled latch-up event as part of the overall protection scheme. The critical dimensions $CD_1$–$CD_4$ are adjusted in order to set the beta of the PNP and NPN transistors to provide latch-up during an ESD event.

During the initial phases of an ESD event the potential in p+ region 64 first increases until the breakdown of the n+ region 66-to-substrate 50 junction initiates the triggering of the SCR. At the same time, the rising potential at node 33 also generates leakage current 70 across the thick-field oxide device; this current aids in activating the SCR to achieve effective clamping. Since ESD events are normally very short (>100 nanoseconds), the heating of the current conduction region occurs adiabatically and cooling by conduction to adjacent regions is negligible The uniformity and the spread of the current conduction provided by the STSCR reduces the heating for a given STSCR discharge and allows the ESD performance to be scaled by size.

For the STSCR to trigger, two conditions must be met: First, the product of the parasitic PNP and NPN bipolar transistor forward current gains (betas) must be larger than 1. Secondly, the junction that is breaking down needs to leak enough so that the voltage developing in the n-well or substrate regions is greater than approximately 0.7 volts. This forward bias represents the emitter-base junction potential of one of the transistors and initiates STSCR action. Parasitic bipolar gains of approximately 7 and 10 (for PNP and NPN devices, respectively) provide adequate STSCR performance.

As explained above, the SCR action triggers after the n-well-to-substrate junction breaks down. In conventional semiconductor processes this breakdown voltage is normally approximately 40 volts. In order to lower the trigger voltage to safe values, the self-triggering feature includes n+ region 66 in a position such that it overlaps the edge of n-well region 60, which is coupled to the n+ cathode diffusion. This overlap serves several purposes. First, it reduces the junction breakdown from 40 volts to approximately 12 volts. Second, it localizes the breakdown at an optimal place to initiate SCR action. Thirdly, it is not connected externally and therefore it acts as the self-triggering mechanism.

It should be understood that the n+p junction breakdown between region 66 and substrate 50 is normally a highly localized, non-uniform phenomena having positive temperature feedback. Therefore, the design should be such that the SCR triggers at currents low enough to avoid inflicting permanent damage to this junction. On the other hand, the triggering current should he high enough to avoid accidentally triggering the SCR which could result in latch-up and destruction of the integrated circuit. Balancing these two concerns requires careful selection of the critical dimensions $CD_1$–$CD_4$. Note that in a current implementation, the trigger current of the STSCR of FIG. 8 is between 10 and 30 mA.

The significance of the critical dimensions $CD_1$, $CD_2$, $CD_3$, and $CD_4$, are as follows. The sum of all of the dimensions ($CD_1+CD_2+CD_3+CD_4$) should be large enough so that the semiconductor volume involved in the conduction allows sufficient energy to be dissipated for high-energy ESD performance. On the other hand, these dimensions should be small enough so that low levels of leakage current can properly turn on one of the parasitic bipolar transistors, thereby triggering the SCR. Moreover, self-triggering by means of low levels of leakage current ensures that the n+p junction is not damaged. Critical dimension values of 1.1, 1.4, 1.2 and 1.2 microns for $CD_1$–$CD_4$, respectively, provide adequate results—even when considering relative variations due to processing.

FIG. 9 illustrates a circuit schematic diagram of the STSCR shown in FIG. 8. Note that the PNP and NPN bipolar devices are shown as transistors 87 and 88, respectively. The n-well resistance $R_n$ is depicted as resistor 85 coupled between the base of transistor 87 and node 33. Similarly, the substrate resistance $R_p$ is shown as resistor 84 coupled between the base of transistor 88 and node 34. The thick field oxide device 79 is shown coupled between node 80 and node 34.

It should be understood that the STSCR device illustrated in FIGS. 8 and 9 is also capable of providing ESD protection by itself. That is, node 33 can be connected directly to the bonding pad of the integrated circuit, with node 80 being connected to the input buffer. By way of example, FIG. 9 shows this configuration with node 80 being coupled to input buffer 81. Thus, the STSCR described has two potential uses. First as a power supply clamp providing a robust performance against electrostatic charges of all polarities. When used in this manner, the I/O active and parasitic transistors and diodes route the ESD current pulse to the core $V_{cc}$–$V_{ss}$ capacitor. If this capacitance is large enough, it can effectively improve ESD performance by acting as a dump for the charge from the current pulse without raising the voltage to levels dangerous to the gate oxide. When the SCR clamp is placed in parallel with the capacitor as shown in FIG. 2, it provides an added safety feature to prevent the $V_{cc}$ core voltage from exceeding 12 volts. Alternatively, the invented STSCR can be employed as an input-only protection device; for example, in a circuit such as that shown in FIG. 3 to provide protection for input-only pins.

Whereas many alternations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiment are not intended to limit the scope of the claims which themselves recite only those features regarded as essential to the invention.

What is claimed is:

1. A device for protecting an integrated circuit (IC) against electrostatic discharge (ESD) comprising:

a first diode having its anode coupled to a pad of said IC and its cathode coupled to a first supply potential;

a second diode having its anode coupled to a second supply potential and its cathode coupled to said pad;

a resistance connected between said pad and an input node of said IC;

a third diode having its anode coupled to said input node and its cathode coupled to said first supply potential;

a fourth diode having its anode coupled to said second supply potential and its cathode coupled to said input node;

a silicon controlled rectifier (SCR) having an anode coupled to said first supply potential and a cathode coupled to said second supply potential, said SCR exhibiting a snap-back in its current versus voltage characteristic which is triggered at a predetermined voltage during an ESD event, when said predetermined voltage is exceeded said SCR providing a low resistance path between said first and said second supply potentials, thereby protecting internal junctions of said IC from destructive reverse breakdown;

said SCR comprising a pnpn semiconductor structure having a n-well disposed in a p-substrate; a first n+ region and a p-type region disposed in said n-well, said n+ and p-type regions being spaced-apart and electrically connected to comprise said anode; a second n+ region disposed in said substrate across an edge of said n-well; a third n+ region disposed in said substrate, said third n+ region being spaced a first distance away from said edge of said n-well and a second distance away from an edge of said second n+ region with said first distance being larger than said second distance, said third region comprising said cathode; and a fourth n+ region separated from said third n+ region by a first field oxide region, said fourth n+ region being coupled to said anode through a resistor, said fourth n+ region providing a leakage current to said third n+ region to aid in triggering said SCR; and wherein said predetermined voltage is defined by a breakdown voltage between said second n+ region and said p-substrate.

2. The device of claim 1 wherein said second and third n+ regions are separated by a second field oxide region.

3. The device of claim 1 wherein said resistor comprises polysilicon.

4. The device of claim 3 wherein said second n+ region is disposed largely outside of said n-well.

5. A silicon controlled rectifier (SCR) for protecting an input buffer of an integrated circuit (IC) against electrostatic discharge (ESD) comprising:

a n-well disposed in a p-substrate;

a first n+ region and a p-type region disposed in said n-well, said n+ and p-type regions being spaced-apart and electrically connected to form an anode of said SCR;

a second n+ region disposed in said p-substrate across an edge of said n-well;

a third n+ region disposed in said p-substrate spaced a first distance from said edge of said n-well, and a second distance away from an edge of said second n+ region, said first distance being larger than said second distance, said third n+ region comprising a cathode of said SCR, said second and third n+ regions being separated by a second field oxide region;

a fourth n+ region coupled to said anode through a resistor and separated from said third n+ region by a first field oxide region, said fourth n+ region providing a leakage current to said third n+ region to aid in triggering said SCR;

said SCR exhibiting a snap-back in its current versus voltage characteristic which is triggered at a predetermined voltage during an ESD event, when said predetermined voltage is exceeded said SCR providing a low resistance path across first and second supply lines of said IC, wherein said predetermined voltage is defined by the breakdown voltage between said second n+ region and said p-substrate.

6. The SCR of claim 5 wherein said resistor comprises polysilicon.

7. The SCR of claim 6 wherein said second n+ region is disposed largely outside of said n-well.

8. A device for protecting an integrated circuit (IC) against electrostatic discharge (ESD) comprising:
   a first diode having an anode coupled to a pad of said IC and a cathode coupled to a first supply potential;
   an output buffer including a p-channel device coupled between said first supply potential and said pad, and a n-well resistor coupled between said pad and the drain of a n-channel device, the source of said n-channel device being coupled to a second supply potential;
   a second diode having an anode coupled to said second supply potential and a cathode coupled to said pad through said n-well resistor, said first and second diodes providing a conductive path between said first and second supply potentials, respectively, and said pad during an ESD event;
   a silicon controlled rectifier (SCR) having an anode coupled to a third supply potential and a cathode coupled to a fourth supply potential, said SCR exhibiting a snap-back in its current versus voltage characteristic which is triggered at a predetermined voltage during an ESD event, when said predetermined voltage is exceeded, said SCR providing a low resistance path between said third and fourth supply potentials to protect internal junctions of said IC from destructive reverse breakdown; and
   a pair of diode clamps, one of said clamps coupling said first supply potential to said third supply potential, and the other of said clamps coupling said second supply potential to said fourth supply potential.

9. The device of claim 8 wherein said SCR comprises a pnpn semiconductor structure comprising:
   a n-well disposed in a p-substrate;
   a first n+ region and a p-type region disposed in said n-well, said n+ and p-type regions being spaced-apart and electrically connected to form said anode;
   a second n+ region disposed in said substrate across an edge of said n-well;
   a third n+ region disposed in said substrate spaced a first distance away from said edge of said n-well and a second distance away from an edge of said second n+ region, said first distance being larger than said second distance, said third n+ region comprising said cathode of said SCR; and
   a fourth n+ region separated from said third n+ region by a first field oxide region, said fourth n+ region being coupled to said anode through a resistor, said fourth n+ region providing a leakage current to said third n+ region to aid in triggering said SCR.

10. The device of claim 9 wherein said predetermined voltage is defined by the breakdown voltage between said second n+region and said p-substrate.

11. The device of claim 10 wherein said second and third n+ regions are separated by a second field oxide region.

12. The device of claim 10 further comprising:
    a resistance coupling said pad to an input node of said IC;
    a third diode coupling said input node to said third supply potential; and
    a fourth diode coupling said fourth supply potential to said input node.

13. The device of claim 12 wherein said resistor comprises polysilicon.

14. The device of claim 13 wherein said second n+ region is disposed largely outside of said n-well.

* * * * *